(12) United States Patent
Lai et al.

(10) Patent No.: US 10,529,541 B2
(45) Date of Patent: Jan. 7, 2020

(54) INDUCTIVE PLASMA SOURCE WITH METALLIC SHOWER HEAD USING B-FIELD CONCENTRATOR

(71) Applicant: Applied Materials, Inc., Santa Clara, CA (US)

(72) Inventors: Canfeng Lai, Fremont, CA (US); Jeffrey Tobin, Mountain View, CA (US); Peter I. Porshnev, Poway, CA (US); Jose Antonio Marin, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 392 days.

(21) Appl. No.: 15/462,507

(22) Filed: Mar. 17, 2017

(65) Prior Publication Data

US 2017/0194128 A1 Jul. 6, 2017

Related U.S. Application Data

(63) Continuation of application No. 12/780,531, filed on May 14, 2010, now abandoned.

(51) Int. Cl.
*H01J 37/32* (2006.01)

(52) U.S. Cl.
CPC ....... *H01J 37/3211* (2013.01); *H01J 37/3244* (2013.01); *H01J 37/32532* (2013.01); *H01J 2237/33* (2013.01)

(58) Field of Classification Search
CPC .............. H01J 37/3211; H01J 37/3244; H01J 37/32532; H01J 37/32541; H01J 2237/33;

(Continued)

(56) References Cited

U.S. PATENT DOCUMENTS 5,505,778 A * 4/1996 Ono ...................... C23C 16/452
118/715
5,653,811 A * 8/1997 Chan ...................... H01J 37/20

(Continued)

FOREIGN PATENT DOCUMENTS

JP  2000511701 A  9/2000
JP  2000331993 A  11/2000

(Continued)

OTHER PUBLICATIONS

International Search Report PCT/US2011/033735 dated Apr. 25, 2011.

(Continued)

*Primary Examiner* — Charlee J C Bennett
(74) *Attorney, Agent, or Firm* — Patterson + Sheridan LLP

(57) ABSTRACT

A method and apparatus for plasma processing of substrates is provided. A processing chamber has a substrate support and a lid assembly facing the substrate support. The lid assembly has a plasma source that comprises a coil disposed within a conductive plate, which may comprise nested conductive rings. The coil is substantially coplanar with the conductive plate, and insulated therefrom by an insulator that fits within a channel formed in the conductive plate, or nests within the conductive rings. A field concentrator is provided around the coil, and insulated therefrom by isolators. The plasma source is supported from a conductive support plate. A gas distributor supplies gas to the chamber through a central opening of the support plate and plasma source from a conduit disposed through the conductive plate.

19 Claims, 3 Drawing Sheets

(58) Field of Classification Search
CPC ............ C23C 16/45565; C23C 16/509; C23C 16/5096
USPC ......... 156/345.48, 345.49; 118/723 I, 723 IR
See application file for complete search history.

(56) References Cited

U.S. PATENT DOCUMENTS

| | | | |
|---|---|---|---|
| 5,683,548 | A | 11/1997 | Hartig et al. |
| 5,904,780 | A | 5/1999 | Tomoyasu |
| 6,225,746 | B1 | 5/2001 | Wickramanayaka |
| 6,230,651 | B1 | 5/2001 | Ni et al. |
| 6,244,211 | B1 * | 6/2001 | Nishikawa .......... C23C 16/4401 118/723 AN |
| 6,259,209 | B1 * | 7/2001 | Bhardwaj ................ H05H 1/46 156/345.12 |
| 6,392,351 | B1 | 5/2002 | Shun'ko |
| 6,417,626 | B1 * | 7/2002 | Brcka .................. H01J 37/321 118/715 |
| 6,534,922 | B2 * | 3/2003 | Bhardwaj ............. H01J 37/321 315/111.21 |
| 6,706,334 | B1 * | 3/2004 | Kobayashi ........ H01J 37/32082 134/1.1 |
| RE39,939 | E * | 12/2007 | Okayama ............. C23C 16/455 156/345.34 |
| 2002/0121345 | A1 * | 9/2002 | Chen .................... C23C 16/507 156/345.48 |
| 2004/0182517 | A1 * | 9/2004 | Lai .................... H01J 37/32431 156/345.48 |
| 2006/0075967 | A1 | 4/2006 | Lu et al. |
| 2007/0085483 | A1 * | 4/2007 | Ni ....................... C23C 16/4404 315/111.71 |
| 2008/0050292 | A1 * | 2/2008 | Godyak ................ H01J 37/321 422/186.29 |
| 2008/0050537 | A1 * | 2/2008 | Godyak ................ H01J 37/321 427/575 |
| 2008/0308409 | A1 | 12/2008 | Brcka |
| 2009/0139658 | A1 * | 6/2009 | Lea ................... H01J 37/32091 156/345.41 |
| 2011/0204023 | A1 | 8/2011 | Huh et al. |
| 2012/0222618 | A1 * | 9/2012 | Olsen .................... C23C 16/517 118/723 MP |
| 2013/0052830 | A1 | 2/2013 | Kim et al. |

FOREIGN PATENT DOCUMENTS

| | | |
|---|---|---|
| JP | 2001291704 A | 10/2001 |
| KR | 20080070125 A | 7/2008 |
| KR | 20090078682 A | 7/2009 |
| KR | 20090009369 U | 9/2009 |

OTHER PUBLICATIONS

Office Action in related application KR 10-2012-7032671 dated Jun. 20, 2017.

* cited by examiner

INDUCTIVE PLASMA SOURCE WITH METALLIC SHOWER HEAD USING B-FIELD CONCENTRATOR

CROSS-REFERENCE TO RELATED APPLICATIONS

This is a continuation of copending U.S. patent application Ser. No. 12/780,531 filed May 14, 2010, which is incorporated herein by reference.

FIELD

Embodiments described herein generally relate to manufacturing semiconductor devices. More specifically, embodiments described herein relate to methods and apparatus for plasma processing of substrates.

BACKGROUND

Plasma processing is commonly used for many semiconductor fabrication processes for manufacturing integrated circuits, flat-panel displays, magnetic media, and other devices. A plasma, or ionized gas, is generated inside a processing chamber by application of an electromagnetic field to a low-pressure gas in the chamber, and then applied to a workpiece to accomplish a process such as deposition, etching, or implantation. The plasma may also be generated outside the chamber and then directed into the chamber under pressure to increase the ratio of radicals to ions in the plasma for processes needing such treatments.

Plasma may be generated by electric fields, by magnetic fields, or by electromagnetic fields. Plasma generated by an electric field normally uses spaced-apart electrodes to generate the electric field in the space occupied by the gas. The electric field ionizes the gas, and the resulting ions and electrons move toward one electrode or the other under the influence of the electric field. The electric field can impart very high energies to ions impinging on the workpiece, which can sputter material from the workpiece, damaging the workpiece and creating potentially contaminating particles in the chamber. Additionally, the high potentials accompanying such plasmas may create unwanted electrical discharges and parasitic currents.

Inductively coupled plasmas are used in many circumstances to avoid some effects of capacitively coupled plasmas. An inductive coil is disposed adjacent to a plasma generating region of a processing chamber. The inductive coil projects a magnetic field into the chamber to ionize a gas inside the chamber. The inductive coil is frequently located outside the chamber, projecting the magnetic field into the chamber through a dielectric window. The inductive coil is frequently driven by high-frequency electromagnetic energy, which suffers power losses that rise faster than the voltage applied to the inductive coil. Thus, strong coupling of the plasma source with the plasma inside the chamber decreases power losses. Control of plasma uniformity is also improved by strong coupling between the plasma source and the plasma.

As device geometry in the various semiconductor industries continues to decline, process uniformity in general and plasma uniformity in particular, becomes increasingly helpful for reliable manufacture of devices. Thus, there is a continuing need for inductive plasma processing apparatus and methods.

SUMMARY

Embodiments described herein provide a lid assembly for a plasma chamber, the lid assembly having a first annular coil nested with a first conductive ring.

Other embodiments provide a processing chamber for a semiconductor substrate, the processing chamber having a chamber body that defines an interior region, a substrate support disposed in the interior region, and a lid assembly disposed in the interior region facing the substrate support, the lid assembly having a gas distributor and a plasma source with a first conductive surface that faces the substrate support, a second conductive surface that faces away from the substrate support, and a plurality of coils disposed in the conductive plasma source between the first surface and the second surface.

Other embodiments provide a method of processing a substrate by disposing the substrate on a substrate support in a processing chamber, providing a plasma source facing the substrate support, the plasma source comprising a plurality of conductive loops disposed in an electrode, to define a processing region between the plasma source and the substrate support, providing a gas mixture to the processing region, grounding the electrode, and forming a plasma from the gas mixture by applying electric power to the conductive loops.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
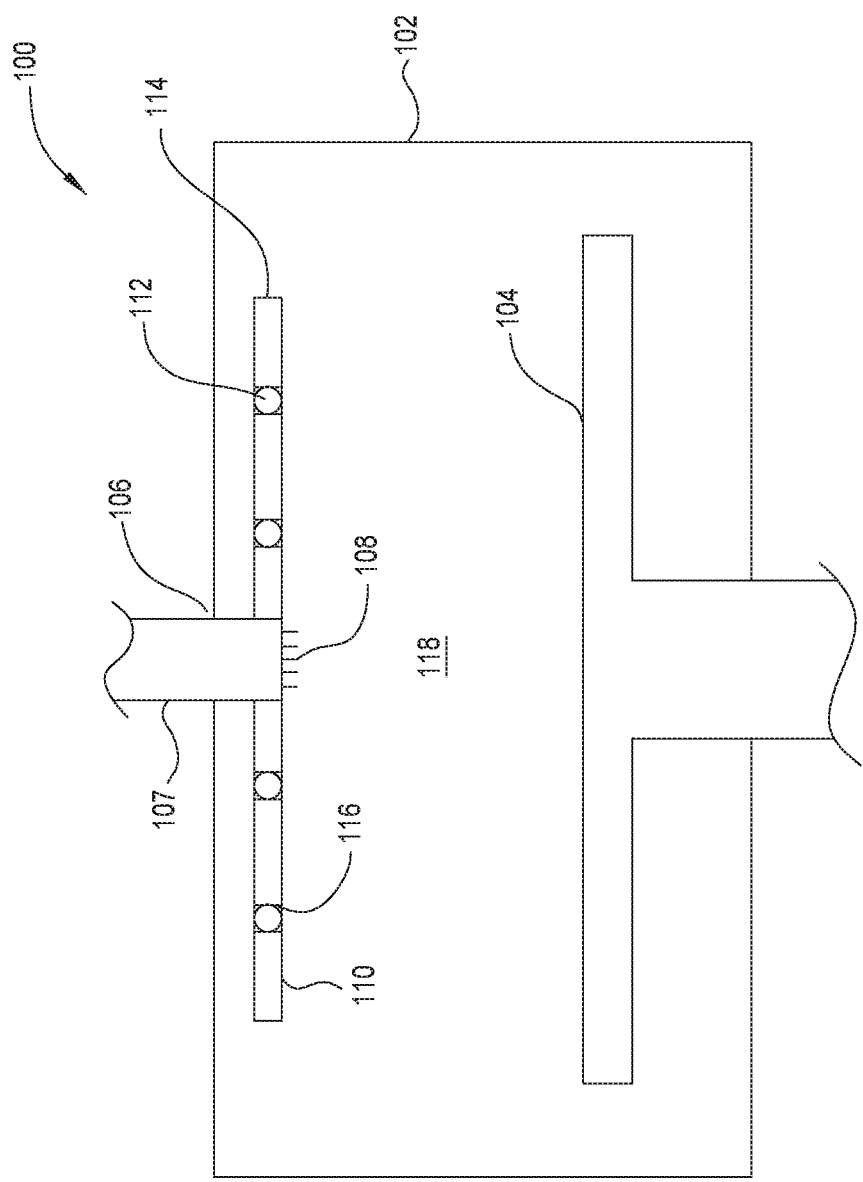
FIG. 1 is a schematic cross-sectional view of a processing chamber according to one embodiment.

FIG. 1 is a schematic cross-sectional diagram of a processing chamber 100 according to one embodiment. The processing chamber 100 comprises a chamber body 102, a substrate support 104, and a gas distributor 106 facing the substrate support 104, the gas distributor 106 and substrate support 104 defining a processing region 118. The gas distributor 106 comprises a showerhead 108, a gas conduit 107, and a plasma source 110 surrounding the showerhead 108. The plasma source 110 comprises a conductive spacer 114 and a coil 112 disposed inside the conductive spacer 114. There may be one or more coils 112 disposed in the conductive spacer 114. The conductive spacer 114 may be a disk-like member with channels or conduits housing the coils 112. Alternately, the conductive spacer 114 may be a plurality of rings separating the coils 112 and nesting with the coils 112. Each of the coils 112 is housed in a channel or recess 116 lined with an insulating material. The insulating material of the channel or recess 116 prevents electric current travelling from the coils 112 into the conductive spacer 114. The coils 112 produce a magnetic field in the processing region 118 that ionizes a processing gas disposed therein to form a plasma. In some embodiments, the coil 112 may be a coil assembly featuring a removable insulating member, as further described below in connection with FIG. 2. In one embodiment, the coil 112 is conductive.

The conductive spacer 114 provides a large surface area grounded electrode that faces the substrate support 104. The large grounded electrode allows generation of higher voltages at the substrate support using lower power levels. Disposing the coils 112 in the conductive spacer 114 also brings the plasma source close to the plasma generation area of the processing region 118, improving coupling efficiency with the plasma. Additionally, the large grounded surface area of the conductive spacer 114 reduces plasma sheath voltage in the chamber, which reduces sputtering of chamber walls and chamber lid components, reducing contamination of workpieces disposed on the substrate support. Use of multiple coils 112 also provides the possibility of using different power levels on the coils to tune the plasma profile in the processing region 118.

Figure 2:
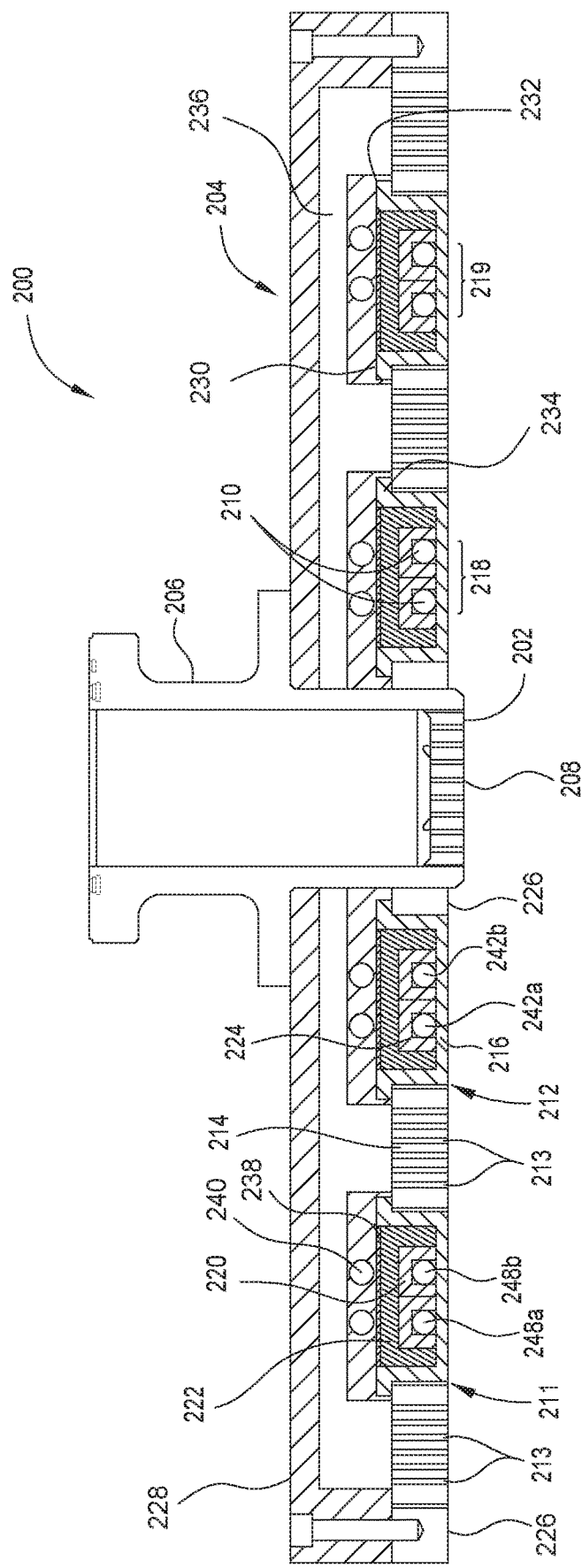
FIG. 2 is a schematic cross-sectional view of a lid assembly according to another embodiment.

FIG. 2 is a schematic cross-sectional diagram of a lid assembly 200 according to another embodiment. Similar to the gas distributor 106 of FIG. 1, the lid assembly 200 comprises a showerhead 202, a gas conduit 206, and a plasma source 204. The gas conduit 206 connects a gas source (not shown) to the showerhead 202, placing the gas source in fluid communication with a processing chamber through openings 208 in the showerhead 202.

The plasma source 204 comprises a support member 228, conductive gas distribution rings 214, and a coil 210 disposed in a channel 212 formed between the conductive gas distribution rings 214. As illustrated in FIG. 2, the lid assembly 200 includes more than one channel 212, 211. For example, an innermost channel 212 is formed between an inner gas distribution ring 214 and the gas conduit 206 and an outermost channel 211 is formed between the gas distribution rings 214. The gas conduit 206 is disposed through a central portion of the support member 228. The gas distribution rings 214 may be metal or metal alloy, and may be coated with a dielectric material, if desired, or a chemically resistant or plasma resistant material, such as yttria, in some embodiments. The coil 210, of which there may be more than one, may also be metal, metal alloy, or a conductive composite such as a metal coated dielectric or a metal composite featuring metals having different conductivities. The coil 210 may be conductive or inductive. Material selection for the coil 210 generally depends on the desired thermal and electrical conductivity. Materials with lower electrical conductivity are generally lower in cost, but a coil 210 made from low conductivity materials may generate unwanted heat, and may require excessive power to operate. Highly conductive materials such as copper and silver may be used proficiently for the coil 210. Less conductive and lower cost materials such as aluminum, zinc, or nickel may be included as alloy or layer components.

Heat may be dissipated by forming the coil 210 with a conduit for a thermal control medium, which may be a cooling liquid such as water or a cooling gas such as nitrogen. The coil 210 may be an annular or toroidal tube in some embodiments. The tube wall thickness may be specified based on thermal and electrical conductivity needed. Cooling may be useful when high power, for example greater than about 500 W, is to be applied to the coil 210. In one embodiment, the coil 210 is a toroidal tube comprising a layer of copper and a layer of silver. The power applied to the coil 210 may be radio frequency (RF) power.

Each channel 212 is generally lined with an insulating member 216, which may be ceramic or plastic, Teflon, for example. The insulating member 216 confines the electric current to the coil 210. The insulating member 216 may be an insert that fits into the channel 212, or in other embodiments, may be a liner adhered to an inner surface of the channel 212. The embodiment of FIG. 2 features two insulating members 216, each of which is an annular member that fits inside a respective channel 212, one of the insulating members 216 fitting inside the innermost channel 212, which is a first channel in the embodiment of FIG. 2, and the other insulating member 216 fitting inside the outermost channel 211, which is a second channel in the embodiment of FIG. 2. The second channel 211 is radially outward of the first channel 212. Each of the first channel 212 and the second channel 211 has a coil 210 disposed therein. In the embodiment of FIG. 2, a first conductive loop 218 includes a pair of coils 210. For example, the first conductive loop 218 includes a first coil 242a and a second coil 242b. A second conductive loop 219 also comprises a pair of coils 210. For example, the second conductive loop 218 includes a third coil 248a and a fourth coil 248b. Each conductive loop 218, 219 rests inside a recess formed by the respective insulating members 216. For example, the first conductive loop 218 rests in the inner channel 212 and the second conductive loop rests in the outer channel 212.

Each coil 210 of the conductive loops 218, 219 are electrically isolated from the other coil 210 of that conductive loop 218, 219, by respective isolators 220, which at least partially surround the coils 210. In the embodiment of FIG. 2, each isolator 220 is an annular dielectric member having a recess 224 into which a coil 210 fits. The recess 224 of an isolator 220 and the recess formed by the insulating members 216 into which the isolator 220 fits generally face in opposite directions. Thus, each coil 210 is surrounded on three sides by an isolator 220 and on one side by an insulating member 216. It should be noted that the isolators 220 may have any convenient cross sectional shape. For example, in an alternate embodiment, the isolators 220 may be rounded to follow the contours of a rounded, tube-like, coil 210, such that the recess 224 has a rounded cross-sectional shape. In another embodiment, the cross-sectional profile of each isolator 220 and/or each recess 224 may be rectangular with beveled corners. In still other embodiments, each coil 210 may be formed with a coating that isolates the coils of a respective conductive loop 218, 219. The isolators 220 may be any insulating material, such as ceramic, glass, or plastic. In the embodiment of FIG. 2, each isolator 220 is shown as a single piece covering a single coil 210, but in alternate embodiments, an isolator 220 may be formed to cover two neighboring coils 210 while disposing a wall between the neighboring coils 210.

A field concentrator 222 is disposed around each conductive loop 218 to amplify the magnetic field produced by each conductive loop 218. In the embodiment of FIG. 2, the field concentrator 222 is disposed around a pair of coils 210 and their respective isolators 220, but in other embodiments, each coil 210 may be paired with a field concentrator 222, or more than two coils 210 may be paired with a field concentrator 222. The field concentrator 222 focuses the magnetic field produced by the respective conductive loop 218, 219 toward the plasma generation area of the processing region, minimizing magnetic energy projecting away from the plasma generation area. Each field concentrator 222 generally comprises ferrite or other magnetically susceptible or magnetizable materials, such as low coercivity materials. Thermal control of the coils 210 minimizes temperature variation of the field concentrator 222, maintaining the magnetic properties thereof for control of the magnetic field produced by the coils 210.

The coils 210 are nested in the insulating members 216 which are interposed with the gas distribution rings 214. Conductive members 226 may also be interposed with the coils 210 and the gas distribution rings 214. In one embodiment, the conductive members 226 are rings that comprise metal, metal alloy, or metal mixtures, each of which may be attached to the support member 228. The insulating members 216 fit between the conductive members 226 and the gas distribution rings 214 to provide a channel in which the coils 210 are disposed. The channel of the insulating members 216 is substantially coplanar with the gas distribution rings 214 and the conductive members 226. That is, the coils 210 are substantially coplanar with the gas distribution rings 214 and the conductive members 226. Additionally, the insulating members 216 form a flat surface with the gas distribution rings 214.

The support member 228 is generally also conductive. In some embodiments, the support member 228 is a metal block (i.e., a plate). In another embodiment, the support member 228 is an electrode. The support member 228 has recesses 230 that, together with the gas distribution rings 214 or the conductive members 226, define capture spaces 232 into which respective shoulder portions 234 of each insulating member 216 are captured to secure the insulating members 216 into the lid assembly 200. The gas distribution rings 214 and the conductive members 226 may be grounded and thus allow for a large grounded surface to be brought into close proximity to the plasma, enabling higher bias voltage to be used on the substrate support at lower power levels and lower heat input (see FIG. 1). The lid assembly 200 configuration of FIG. 2 also brings the plasma source energy of the coils 210 into close proximity with a gas in the processing region, resulting in a higher plasma density at lower power levels. Use of multiple coils, such as the coils 210, also enables tuning of the plasma profile generated in the chamber by adjusting the power level applied to each individual coil.

The support member 228 comprises one or more conduits 236 (i.e., a plenum) that bring process gases to the gas distribution rings 214. In FIG. 2, the conduit 236 is formed through the support member 228 above the gas distribution rings 214 and radially outward from the showerhead 202. Additionally, in some embodiments, the gas distribution rings 214 may comprise conduits (not shown) to disperse gas from the conduit 236 around the circumference of the gas distribution member 214 for even gas distribution in the processing region. Additionally, the conduit 236 is in fluid communication with the processing region via a plurality of openings 213 formed through the gas distribution rings 214. By interposing the gas distribution rings 214 with the coils 210, the lid assembly 200 may be used as both a plasma source and a showerhead. Gas flow is distributed evenly across the face of the lid assembly 200, and RF power is close-coupled to the process gas exiting the plurality of openings 213 formed through gas distribution rings 214.

Thermal control may be enhanced by optionally including thermal control conduits 240 in the support member 228. Locating thermal control conduits 240 in the support member 228 may enhance thermal control of the field concentrators 222, which are otherwise at least partially insulated from any thermal control fluid circulating through the coils 210 by the isolators 220. Thermal control in the vicinity of the field concentrators 222 may be advantageous for maintaining electromagnetic properties of the field concentrators 222. Also optionally, a cushion 238 may be disposed between the field concentrators 222 and the support member 228 to avoid any damage to the field concentrators 222, which may be easily damaged by direct contact with the metal surface of the support member 228. The cushion 238 may be a thermally conductive material such as Grafoil®, which is a flexible graphitic sealing material manufactured by Natural Graphite Operations, of Lakewood, Ohio, a subsidiary of GrafTech International, and distributed by Leader Global Technologies, of Deer Park, Tex.

In general, the lid assembly 200 may have any convenient shape or size for processing substrates of any dimension. The lid assembly 200 may be circular, rectangular, or any polygonal shape. The lid assembly 200 may be of a size and shape adapted for processing semiconductor wafers for making semiconductor chips of any description, or the lid assembly 200 may be of a size and shape adapted for processing semiconductor panels such as large-area display or solar panels. Other types of substrates, such as LED substrates or magnetic media substrates, may also be processed using a lid assembly as herein described. In some embodiments, the coil (or coils) 210 may be disposed in a concentric circular shape, in a concentric non-circular (rectangular, polygonal, square, or irregular) shape, or in a non-concentric shape such as a boustrophedonic or zig-zag pattern. In another non-concentric embodiment, the coil (or coils) 210 may be disposed in a spiral pattern.

In some embodiments, a lid assembly may be similar to the lid assembly 200 of FIG. 2, with some differences. In one embodiment, the lid assembly may have a curved surface facing the substrate support, curved in a convex or concave sense. In one aspect, the entire plasma source may be curved (i.e., the surface of the plasma source facing the substrate support and the surface facing away from the substrate support are both convex or concave). In another aspect, only the surface of the lid assembly facing the substrate support may be curved. In one embodiment, multiple showerheads may be provided, especially for large area lid assemblies. In one embodiment, gas may be injected through the conductive members 226 by providing one or more conduits through the support member 228. In other embodiments, coils may be provided that comprise a single electrical circuit, rather than multiple discrete circuits. For example, in one embodiment, the coil may be arranged in a planar, circular or rectangular spiral shape nested with, or disposed in, a complementary conductive member such that the conductive member and the coil form a substantially planar plasma source. Such a spiral shape may also be z-displaced such that the plasma source is not planar, but has a z-dimension in a convex or concave sense.

Figure 3:
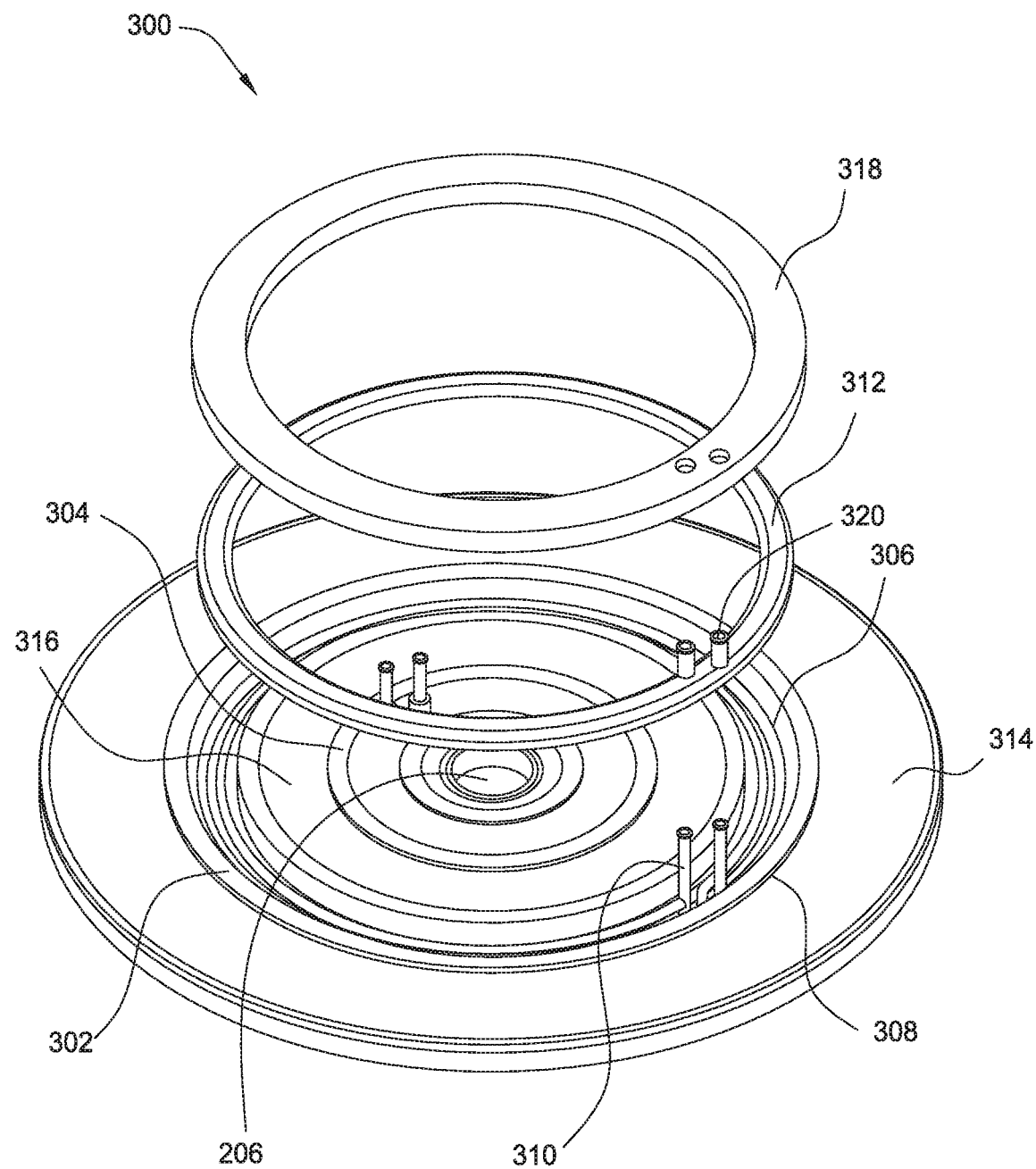
FIG. 3 is an exploded view of a lid assembly according to another embodiment.

FIG. 3 is an exploded view of a lid assembly 300 according to another embodiment. The lid assembly 300 is similar in most respects to the lid assembly 200 of FIG. 2, and identical features are labeled with the same identifying labels. The lid assembly 300 comprises a gas conduit 206 for delivering gas to the process region of the chamber on which the lid assembly 300 is installed. The lid assembly 300 further comprises a first conductive loop 302 and a second conductive loop 304 similar to the first conductive loop 302, with the first conductive loop 302 shown in exploded format. The first conductive loop 302 comprises a plurality of coils 306 disposed in an insulating channel 308. In the embodiment of FIG. 3, the coils 306 are circular and concentric, but in alternate embodiments the coils 306 may be disposed in any convenient configuration, as described herein. Each of the coils 306 has a contact 310 for supplying power to the coils 306. As described elsewhere herein, the coils 306 may be conductive tubes configured to carry a coolant in addition to electric power. Thus, the contacts 310 may also be used to provide coolant to the coils 306.

The coils 306 are generally metal, or other electrically conductive material. The metal may be a single metal, an alloy, a mixture, or another combination of metals. The coils 306 may also be coated with a non-conductive material, such as ceramic or polymer, in some embodiments. In one embodiment, the coils 306 are copper tubes plated with silver. The metals to be used generally depend on the electrical and thermal properties needed for the particular embodiment. In high power applications, higher electrical conductivity will generally result in lower thermal budget, so more conductive materials may be advantageous. It should be noted that when multiple coils are used, each of the coils may have a different composition. For example, silver plated copper tubes may have different thicknesses of silver plating or different tube wall thicknesses to provide differential conductivity among the tubes. In other embodiments, each conductive loop 302 and 304 may have only one coil, or more than two coils.

An insulator 312 is disposed over the coils 306 so that the coils 306 are surrounded by insulative material. This prevents electric power from flowing to conductive rings 314 and 316 interposed between the first conductive loop 302 and the second conductive loop 304. The insulator 312 comprises a wall that is not visible in the top-perspective view of FIG. 3. The wall extends between the two coils 306 to prevent electrical cross-talk between the coils 306 in a given conductive loop 302 or 304. Thus, each coil 306 is surrounded by insulative material. When power is provided to the coils 306, a magnetic field is generated by the coils 306. A field concentrator 318 is disposed partially around the coils 306 to focus and direct the magnetic field in the direction of the processing region for improved efficiency.

The insulator 312 further comprises a passage 320 for each contact 310. The passages 320 pass through openings in the field concentrator 318 to provide a pathway for the contacts 310 to be coupled to electric power while preventing electrical contact between the contacts 310 and the field concentrator 318. The contacts 310 protrude through the field concentrator 318, where the contacts 310 may be coupled to an RF source.

As with the embodiment of FIG. 2, any number of conductive loops, such as conductive loops 302 and 304, may be disposed in the lid assembly 300. Similar to the gas distribution rings 214 of FIG. 2, process gases may also be provided through the conductive rings 314 and 316, in addition to or in place of the gas conduit 206, by providing a plurality of openings (not shown) through the conductive rings 314 and 316 to release process gases into the processing region. The lid assembly 300 may also be formed with a curvature according to any of the embodiments described herein.

Embodiments disclosed herein also provide a method of processing a substrate on a substrate support in a process chamber. A plasma source may be provided in a position facing the substrate support to form a plasma for processing the substrate. The method comprises providing a plasma source that has a plurality of coils disposed in an electrode, providing a processing gas to the chamber, grounding the electrode, and forming a plasma from the processing gas by applying power to the coils. The coils may be electrically insulated from the electrode by coating, wrapping, or situating the coils in an electrically insulating material, which may be a container, such as a channel formed in the electrode, or a liner disposed inside a channel formed in the electrode. RF power is applied to the coils, and may be controlled independently to shape the plasma density in the process chamber. The coils may be thermally controlled, if desired, by circulating a thermal control medium, such as a cooling fluid, through the tubular coils.

The coils may be substantially coplanar with the electrode in some embodiments. In other embodiments, the electrode may be non-planar, with the coils disposed therein. In still other embodiments, the coils may be partially disposed in the electrode and partially disposed outside the electrode, with any portions of the coils disposed outside the electrode contained or encapsulated in an insulating material.

The plasma may be further enhanced by providing a field concentrator disposed to concentrate the field inside the plasma region of the processing chamber. For example, the field concentrator may generally be disposed opposite the substrate support, such that the coils are between the field concentrator and the substrate support. Such positioning prevents development of magnetic field lines outside the chamber, and focuses the plasma source energy in the processing gas.

While the foregoing is directed to embodiments of the present invention, other and further embodiments of the invention may be devised without departing from the basic scope thereof, and the scope thereof is determined by the claims that follow.

The invention claimed is:

1. A lid assembly for a plasma chamber, comprising:
   a support plate formed from a conductive material;
   a gas conduit disposed through a central portion of the support plate;
   a showerhead coupled to the gas conduit;
   a plurality of holes formed through the showerhead, the plurality of holes in fluid communication with the gas conduit;
   a first conductive ring disposed radially outward of the gas conduit, and wherein the first conductive ring comprises a plurality of first openings;
   a second conductive ring disposed radially outward of the first conductive ring, wherein the second conductive ring comprises a plurality of second openings, the support plate in contact with the first conductive ring and the second conductive ring;
   a first channel formed between the gas conduit and the first conductive ring;
   a second channel formed between the first conductive ring and the second conductive ring;
   an annular coil disposed in the first channel;
   a field concentrator at least partially disposed in the first channel around the annular coil; and
   a plenum formed through the support plate adjacent to the first conductive ring and the second conductive ring, the plenum in fluid communication with the plurality of first openings and the plurality of second openings.

2. The lid assembly of claim 1, wherein the first channel is concentrically disposed with the second conductive ring.

3. The lid assembly of claim 2, wherein the support plate is electrically coupled to the first conductive ring and the second conductive ring.

4. The lid assembly of claim 1, wherein the support plate is electrically coupled to the first conductive ring and the second conductive ring, the annular coil is electrically insulated from the support plate, the first conductive ring, and the second conductive ring, and the annular coil is substantially coplanar with the first conductive ring and the second conductive ring.

5. The lid assembly of claim 1, further comprising:
an isolator disposed in the first channel, the isolator having a recess into which the annular coil fits; and
an insulating liner at least partially disposed in the first channel.

6. The lid assembly of claim 5, wherein the annular coil is substantially coplanar with the first conductive ring and the second conductive ring.

7. The lid assembly of claim 6, wherein the annular coil is a toroidal tube.

8. A lid assembly for a plasma chamber, comprising:
a support plate, wherein the support plate is formed from a conductive material;
a showerhead positioned concentrically with the support plate;
a plurality of holes formed through the showerhead;
a first channel formed in the support plate, the first channel disposed radially outward from the showerhead;
a second channel formed in the support plate, the second channel disposed radially outward from the first channel;
a first conductive loop disposed in the first channel of the support plate;
a second conductive loop disposed in the second channel of the support plate;
a first insulating liner disposed in the first channel, the first insulating liner at least partially around the first conductive loop;
a second insulating liner disposed in the second channel, the second insulating liner at least partially around the second conductive loop;
a first field concentrator disposed in the first insulating liner at least partially around the first conductive loop;
a second field concentrator disposed in the second insulating liner at least partially around the second conductive loop; and
a plenum formed through the support plate radially outward of the showerhead to provide a process gas to a bottom of the support plate between the first channel and the second channel and radially outward of the second channel.

9. The lid assembly of claim 8, wherein each of the first conductive loop and the second conductive loop is annular.

10. The lid assembly of claim 9, wherein each of the first conductive loop and the second conductive loop comprises a plurality of annular coils, and wherein an isolator is disposed around each of the annular coils in each of the first conductive loop and the second conductive loop.

11. The lid assembly of claim 8, further comprising a separate source of RF power coupled to the first conductive loop and the second conductive loop.

12. The lid assembly of claim 8, wherein the first insulating liner is in contact with the support plate.

13. The lid assembly of claim 12, wherein the support plate at least partially defines a plurality of capture spaces, and wherein each of the first insulating liner and the second insulating liner has shoulder portions secured within the capture spaces.

14. The lid assembly of claim 10, wherein each of the annular coils is a toroidal tube.

15. The lid assembly of claim 5, wherein the first conductive ring and the insulating liner form a flat surface.

16. A lid assembly for a plasma chamber, comprising:
a support plate electrode formed from a conductive material;
a gas conduit disposed through a central portion of the support plate electrode, the gas conduit coupled to a showerhead;
a plurality of holes formed through the showerhead;
a first conductive ring in contact with the support plate electrode;
a first plurality of openings formed in the first conductive ring;
a second conductive ring in contact with the support plate electrode;
a second plurality of openings formed in the second conductive ring;
a channel formed between the first conductive ring and the second conductive ring, the support plate electrode disposed adjacent to the channel;
a plenum formed through the support plate electrode and disposed adjacent to the first conductive ring and the second conductive ring, the plenum in fluid communication with the first plurality of openings and the second plurality of openings; and
an annular coil disposed in the channel and disposed at least partially in the support plate electrode, wherein the channel electrically insulates the annular coil from the first conductive ring and the second conductive ring.

17. The lid assembly of claim 16, comprising:
an isolator disposed in the channel and comprising a dielectric, the isolator having a recess into which the annular coil fits;
a field concentrator disposed in the channel around the isolator and the annular coil, wherein the isolator is disposed at least partially between the annular coil and the field concentrator; and
a thermal control conduit disposed in the support plate electrode, wherein the thermal control conduit is disposed proximate the field concentrator so as to provide thermal control of the field concentrator.

18. The lid assembly of claim 17, wherein the annular coil is a toroidal tube.

19. The lid assembly of claim 16, wherein the channel comprises an insulating liner, and wherein the insulating liner and the first conductive ring form a flat surface.

* * * * *